US005721387A

United States Patent [19]

Watanabe et al.

[11] Patent Number: 5,721,387

[45] Date of Patent: Feb. 24, 1998

[54] METHOD OF INSPECTING INCOMPLETE TERMINAL INSERTION AND INSPECTING DEVICE THEREFORE

[75] Inventors: Tomio Watanabe; Toru Nagano; Takayoshi Endo, all of Shizuoka, Japan

[73] Assignee: Yazaki Corporation, Tokyo, Japan

[21] Appl. No.: 661,541

[22] Filed: Jun. 11, 1996

[30] Foreign Application Priority Data

Jun. 13, 1995 [JP] Japan .................................... 7-146045

[51] Int. Cl.$^{6}$ .................................................. H01L 3/16

[52] U.S. Cl. .................................................. 73/865.9

[58] Field of Search ......................... 73/865.9; 200/52 R, 200/56 R, 61.41, 61.58 R, 61.59, 61.62, 61.64, 61.76; 292/253

[56] References Cited

U.S. PATENT DOCUMENTS

| | | | |
|---|---|---|---|
| 3,539,741 | 11/1970 | Voland | 200/61.62 |
| 4,317,969 | 3/1982 | Riegler et al. | 200/52 R |
| 4,376,276 | 3/1983 | Barta | 200/61.62 |
| 4,609,910 | 9/1986 | Geringer et al. | 200/61.62 |

FOREIGN PATENT DOCUMENTS

| | | |
|---|---|---|
| 6-45042 | 2/1994 | Japan . |

*Primary Examiner*—Robert Raevis
*Attorney, Agent, or Firm*—Armstrong, Westerman, Hattori, McLeland & Naughton

[57] ABSTRACT

At the time of continuity inspection of metallic terminal parts of a connector, there is provided a connector inspecting device which is capable Of detecting whether or not there is a correcting operation to the incompletely inserted terminal of this connector comprising a connector supporting body, an inspecting device body which is disconnectable with the connector supporting body, and a switch element of a correcting operation detecting circuit provided for the connector supporting body, wherein the switch element is pushed by the free end section of the resilient piece of a connector to be inspected.

5 Claims, 6 Drawing Sheets

METHOD OF INSPECTING INCOMPLETE TERMINAL INSERTION AND INSPECTING DEVICE THEREFORE

BACKGROUND OF THE INVENTION

1. Field of the Invention

The present invention relates to a connector for use in a wiring harness for motor vehicles, and more particularly to an incomplete insertion inspecting method of a terminal inserted to be locked in a terminal receiving chamber of a connector housing, and an incomplete insertion inspecting device used therefore.

2. Description of the Prior Art

In FIGS. 4 and 5 of the instant patent application there is a reproduction of drawing figures contained in Japanese Patent Application Laid-Open No. 6-45042. In the instant drawing figures there are provided a fixed wall b in the front end of a stand a of an inspecting device A', a connector supporting body c which is opened in the directions of upward, backward and forward at the intermediate section thereof, and an inspecting device body d which is movable backward and forward from the rear section thereof. The connector supporting body c is urged toward the rear by a spring e provided between the fixed wall b and the connector supporting body c. A connector receiving stand f is provided fixedly within the connector supporting body c and two terminal-restricting pins g are raised on the connector receiving stand f (referring to FIG. 6).

A connector-receiving inlet $d_1$ is formed in the front surface of the inspecting device body d and a plurality of inspection pins h are projected forwardly within the connector receiving inlet $d_1$. The inspection pins h are arranged to correspond to the metallic terminal parts of the connector, which are urged ahead by spring e with the pins being disposed so as to make a circuit inside the connector. The inspecting device body d moves backward and forward in accordance with the rotation of the operating lever i provided on one side. A connector housing B' having six terminal-receiving chambers j arranged in three laterally disposed rows are spaced in two vertical layers. Two through-holes k for receiving terminal restricting pins g are formed between two adjacent terminal-receiving chambers j, the two levels of which are covered by an enclosing surface (referring to FIG. 7). An electric wire connecting portion m is provided with a female type electric contacting portion 1 in the metallic terminal parts C' and a tapered connecting shoulder portion $1_1$ is formed at the rear end of the female type electric contacting portion 1.

In the above-described construction, the terminal detection device A' is initially in the condition as shown in FIG. 8A. A connector B" into which the metallic terminal parts C' are inserted, is engaged with the connector supporting body c from above. An electric wire n is connected to each female-type contacting portion 1 of the metallic terminal parts C' beforehand and the connector B" is admitted to the connector supporting body c by the terminal restricting pins g being extended through the rear part $k_1$ of the through-holes k.

In this condition, the operating lever i is rotated and the inspecting device body d is advanced and comes into contact with the connector B" (referring to FIG. 8C), and, in the case of further rotating of the operating lever i, the inspecting device body d moves ahead with the connector supporting body c against the spring e, with the result that the terminal restricting pins g are positioned at the front part $k_2$ of the receiving holes k (referring to FIG. 8D). At this time, the inspection pins h move under pressure contacting with the metallic terminal parts C', and make a circuit within the inspecting device body d. Incompletely inserted metallic terminal parts C" are in a condition as shown in FIG. 9A on the inside of the terminal-receiving chambers j of the connector housing B', when the connector B" is inserted into the connector-supporting body c, as shown in FIG. 8B. Since the terminal-restricting pins g, which are entered into the rear part $k_1$ of the receiving holes k, are positioned at a place in which the terminal-restricting pins g are capable of engaging with the connecting shoulder portion $1_1$ of the metallic terminal parts C", a relative movement takes place between the terminal-restricting pins g and the incompletely inserted metallic terminal parts C" caused by the movement of the connector B" accompanying the movement of the inspecting device body d, whereby the incompletely inserted metallic terminal parts C", restricted by the terminal-restricting pins g, move to the front of the terminal-receiving chambers j (referring to FIG. 9B) and are engaged by a resilient engaging piece (not shown) in a well known manner.

In the above-stated prior art, a connector has only short distance between terminals and a water-proof connector cannot cause the terminal-restricting pin to enter into the connector housing in a vertical direction with regard to the inserting direction of the metallic terminal parts.

SUMMARY OF THE INVENTION

In view of the foregoing, it is an object of the present invention to provide a method for determining an existence of an incomplete insertion of terminals and an inspecting device therefor, in which incompletely inserted terminals are shifted to a condition of complete insertion by using an inserted position correcting jig of the metallic terminal parts for the connector beforehand. Then, by obtaining a determination of whether or not the correcting operation is performed at the time of continuity inspection of the metallic terminal parts by means of the connector inspecting device, it is capable of determining with certainty whether or not the metallic terminal parts are completely inserted in the connector.

According to one aspect of the present invention, for achieving the above-mentioned object, there is provided a connector engagement inspecting method for inspecting an incomplete insertion of metallic terminal parts inserted into a connector housing, wherein the metallic terminal parts are received in a terminal-receiving chamber in the connector housing and locked upon completion of an insertion of the metallic terminal parts by a resilient locking piece provided in the chamber, the inspecting method comprises the steps of: shifting an inserted position-correcting jig of the metallic terminal parts toward the connector housing at the rear end of the connector housing, pushing the metallic terminal parts, which are in an incompletely inserted state, to a completely inserted position thereof, locking a deformed free end portion of a resilient checking piece provided at a side wall of the connector housing, and controlling an operation of a switch element of a correcting operation detecting circuit of the connector inspecting device in accordance with the position of the free end section of the resilient checking piece, at the time of a continuity inspection for the metallic terminal parts by means of the connector-inspecting device.

According to another aspect of the present invention, there is provided a connector engagement inspecting device which comprises a connector supporting body, an inspecting device body which is movable with respect to the connector supporting body, and a switch element of a correcting operation detecting circuit provided for the connector supporting body wherein the switch element is pushed by the free end section of the resilient correcting operation checking piece of a connector to be inspected.

As stated above, according to the connector engagement-inspecting method of the invention, the free end section of the correcting operation resilient checking piece provided for the connecter housing is caused to engage with the side wall section of the housing in consequence of the correcting operation by means of the inserted position correcting jig for the metallic terminal parts. The free end section of the correcting operation resilient checking piece, while locked to the side wall section, pushes the switch element of the correcting operation detecting circuit of the connector inspecting device.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the invention will now be described in detail referring to the accompanying drawings.

Figure 1A:
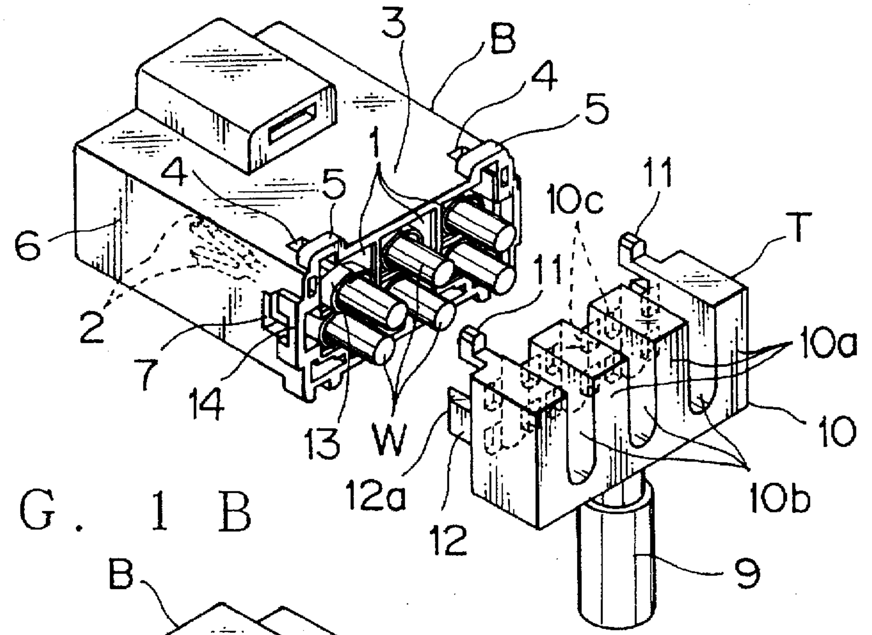
FIGS. 1A, 1B and 1C are perspective views showing an operating process of an inserted position correcting jig completing the insertion of metallic terminal parts into a connector housing according to the present invention.

In FIG. 1, a plurality of metallic terminal parts C, which have previously been connected to electric wires W, are inserted into a plurality of terminal receiving chambers 1 of a connector housing B made of synthetic resin. It is well known that the metallic terminal parts C are engaged in the housing by a resilient locking piece 2 which is formed integrally with the connector housing B to prevent the metallic terminal parts from slipping off when they are in the condition of complete insertion.

Figure 2A:
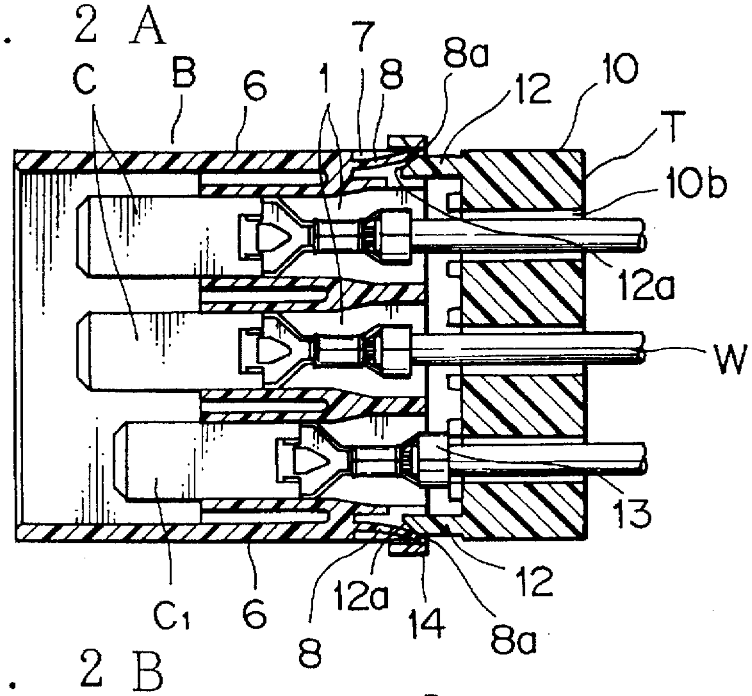
FIGS. 2A and 2B are sectional views also showing the operating process of the inserted position correcting jig for the metallic terminal parts according to the present invention.
Figure 2B:
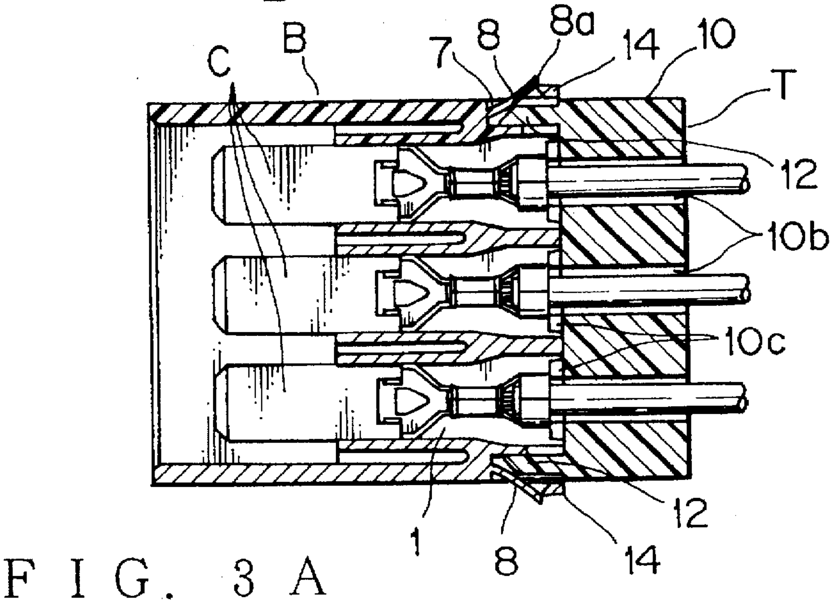

A pair of notch portions 4 for a support and pivot frame 5 are formed on the upper wall 3 in the rear portion of the connector housing B; openings 7 are formed on both sides of the side wall 6; and a resilient correcting operation checking piece 8 (see FIGS. 2A and 2B) for the metallic terminal parts is so disposed on the connector housing that a free end section 8*a* thereof is directed rearwardly within the thickness of the side wall 6 for projection through the opening 7 (referring to FIG. 2).

T is an inserted position correcting jig for correcting the position of an incompletely inserted terminal C1 (referring to FIGS. 1A and 2A) and formed with a pectinate pushing section 10 at the pointed end portion of the holding section 9 thereof. In the pectinate pushing section 10, a fitting lug 11 which projects in a direction substantially perpendicular to the comb-like pieces 10*a* at the upper end of both endmost teeth and is raised upward from the projected end. The wire-receiving grooves 10*b* are formed between each of the comb-like pieces 10*a*, and a protuberance 10*c* of an edge portion of each wire-receiving portion 10*b* at the comb piece 10*a* engages with a rear end portion of the metallic terminal parts C. An operation piece 12 for the resilient correcting operation checking piece 8 is spaced in a perpendicular direction from each of the fitting sections 11 on the inserted position correcting jig T.

Figure 1B:
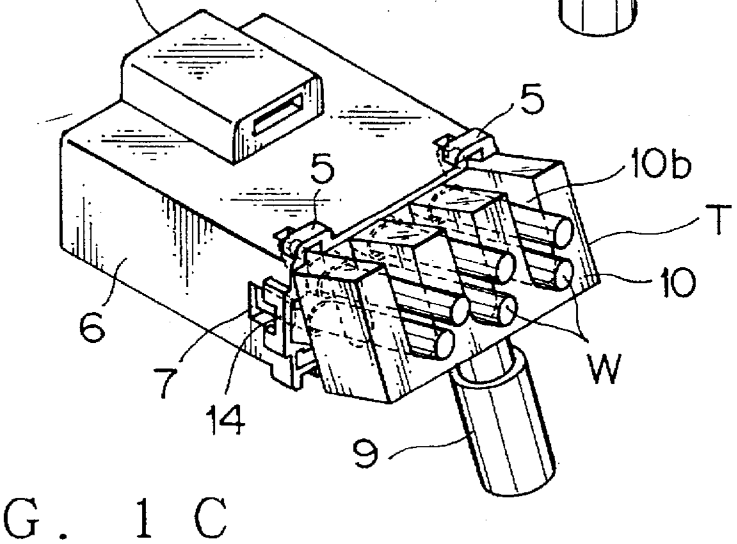

In the above described construction, in case of utilizing the jig T, the pectinate pushing section 10 is first placed rather obliquely against the connector housing B from the lower rear side thereof, and then the fitting sections 11 thereof are locked to the pivot frame 5 by being inserted into the notching portions 4, with the wires W being simultaneously received in the wire-receiving grooves 10*b* (referring to FIG. 1B). Then, when the jig T is rotated in the direction of the connector housing B pivoting on the pivot frame 5, the protuberances 10*c* are abutting against the wire coat crimped portion 13 of an incompletely inserted terminal $C_1$, so that the terminal $C_1$ is shifted to the completely inserted position to be locked by the resilient locking piece 2 (referring to FIG. 1C).

Figure 1C:
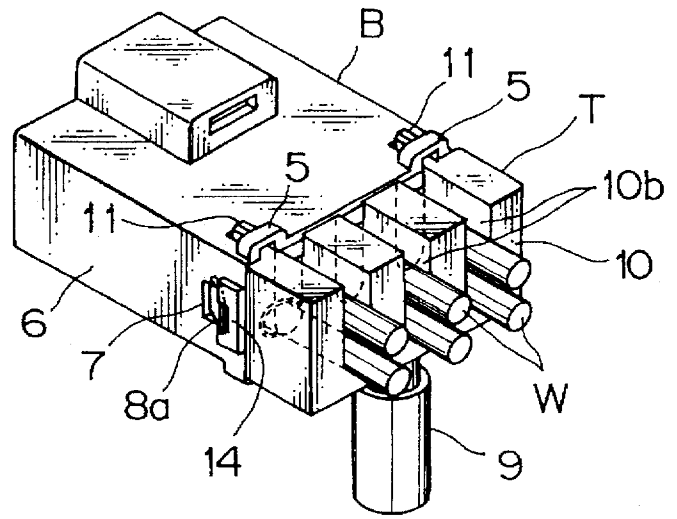

In rotating the inserted position correcting jig T, when the tapered operating section 12*a* of the operation piece 12 is inserted into the opening 7 containing the resilient correcting operation checking piece 8, the free end section 8*a* of the resilient correcting operation checking piece 8 is forced to deflect outwardly toward the outside of the opening 7 (referring to FIG. 2A), and when the operation is completed, the piece 8 is pushed outward from the opening 7 to be locked by the stop bar 14 (referring to FIGS. 1C, 2B).

Figure 3A:
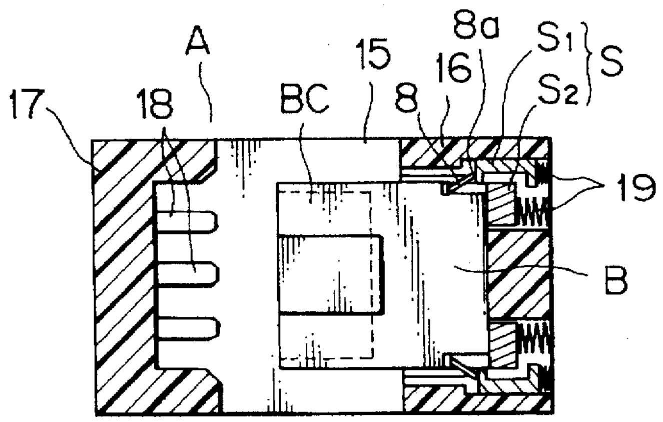
FIGS. 3A and 3B are sectional views showing alternative inspecting conditions for the connector in a connector inspection device according to the present invention.
Figure 3B:
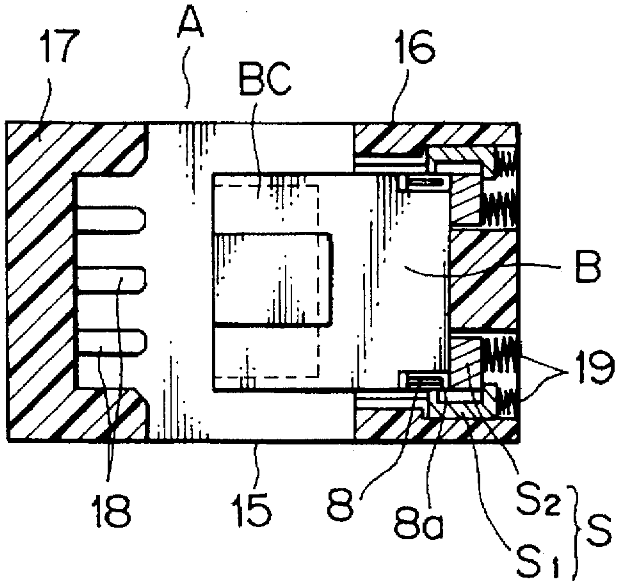
Figure 4:
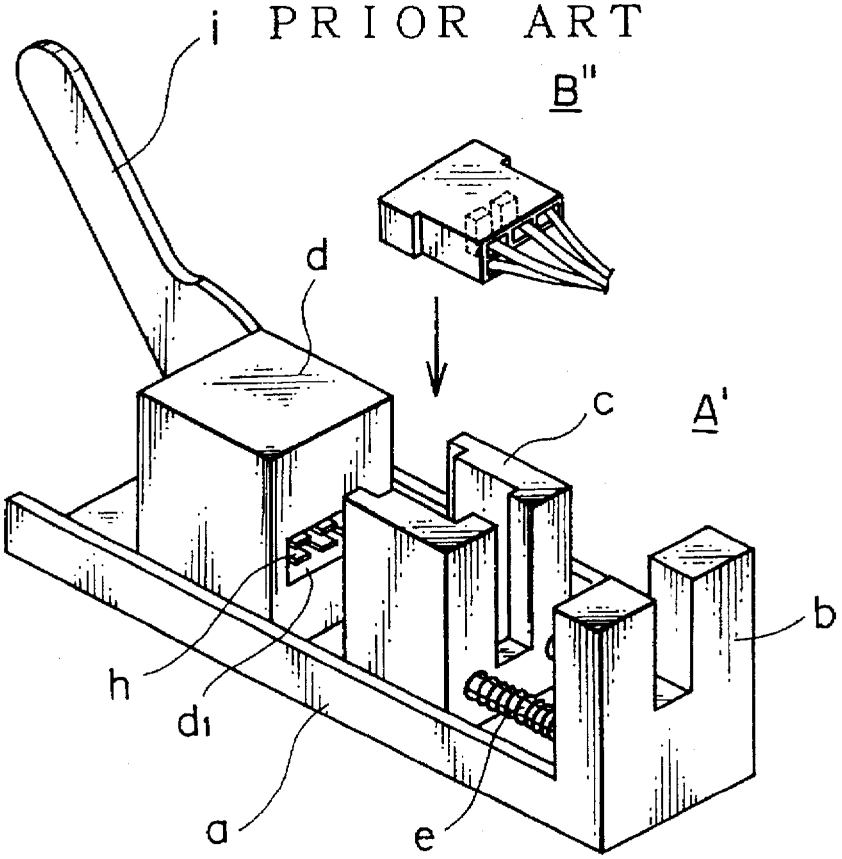
FIG. 4 PRIOR ART
FIG. 4 is a perspective view showing a conventional connector inspection device.
Figure 5:
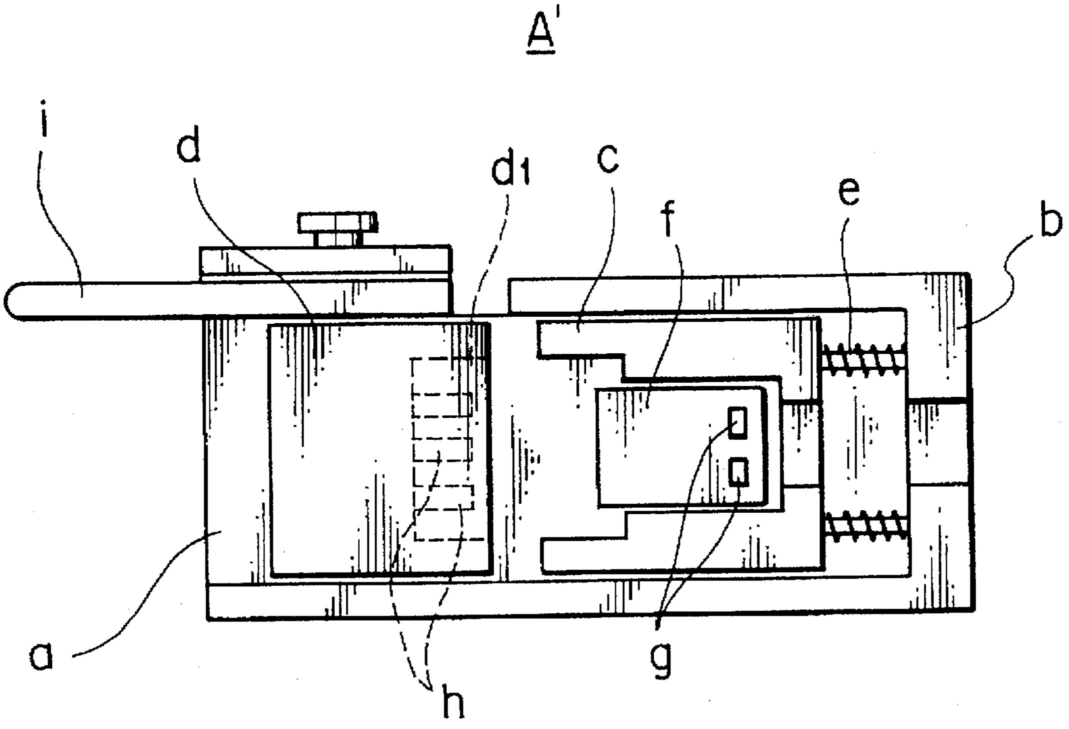
FIG. 5 PRIOR ART
FIG. 5 is a plan view of FIG. 4.
Figure 6:
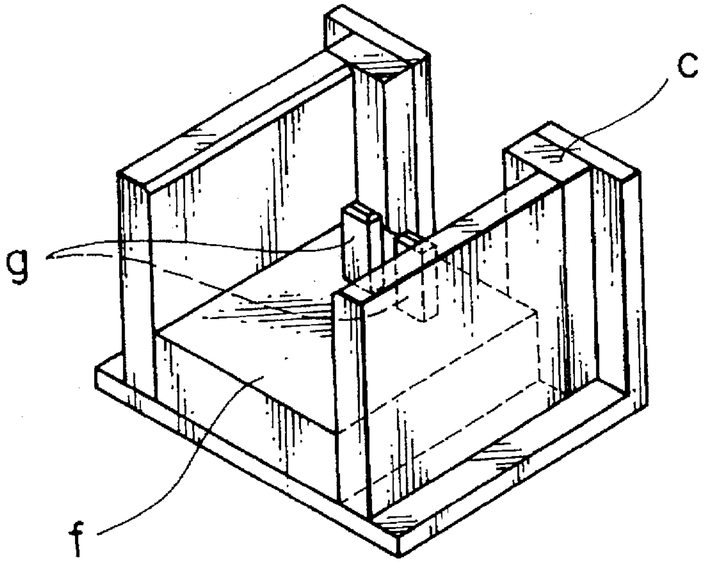
FIG. 6 PRIOR ART
FIG. 6 is a perspective view showing a major portion of the device of FIG. 4.
Figure 7:
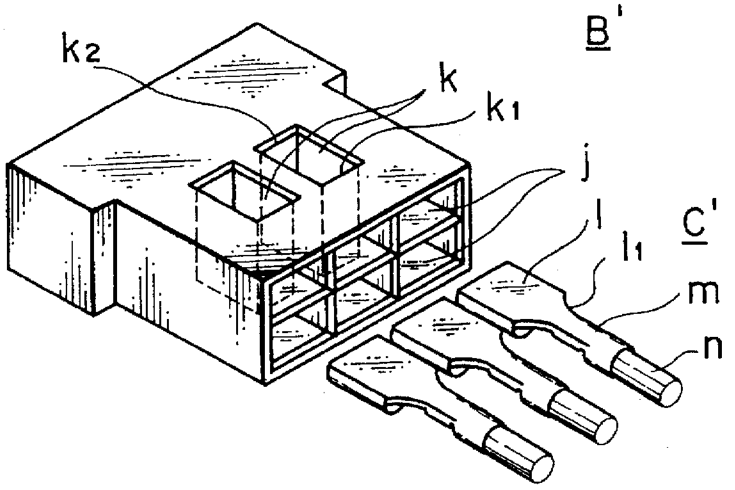
FIG. 7 PRIOR ART
FIG. 7 is a perspective view showing a connector housing and a metallic terminal parts of the device of FIG. 4.
Figure 9A:
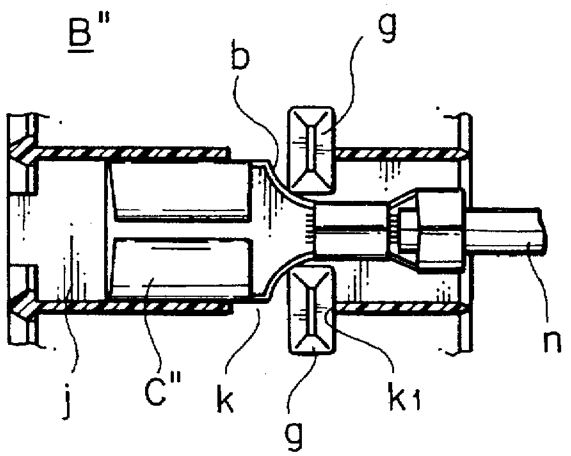
FIG. 9A PRIOR ART
FIGS. 9A and 9B are sectional views showing portions of metallic terminal parts during the inspecting process of the device of FIG. 4.
Figure 9B:
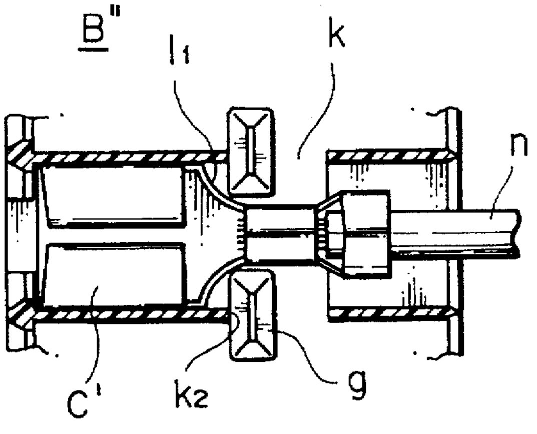
FIG. 9B PRIOR ART
Figure 8A:
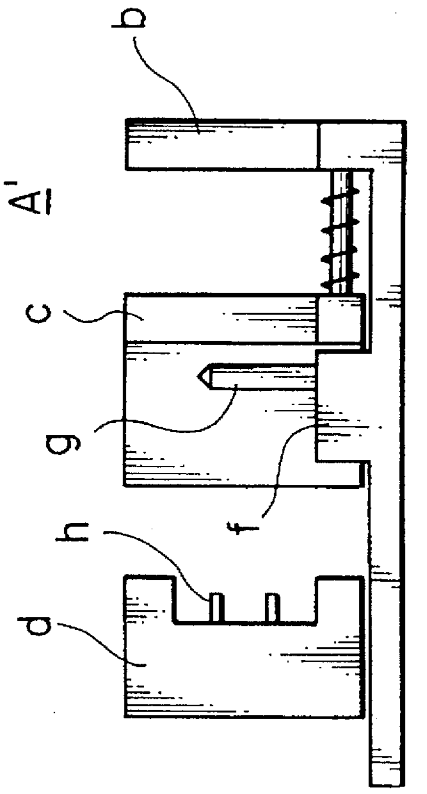
FIG. 8A PRIOR ART
FIGS. 8A, 8B, 8C and 8D are side views showing stages of the inspecting process of the device of FIG. 4.
Figure 8C:
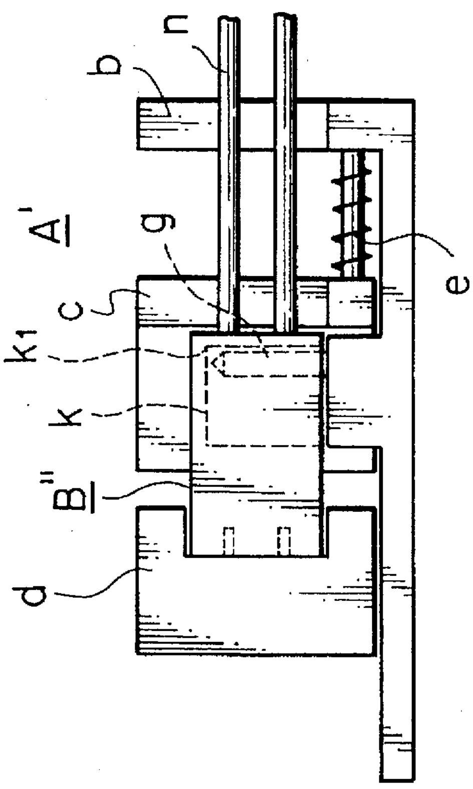
FIG. 8C PRIOR ART
Figure 8B:
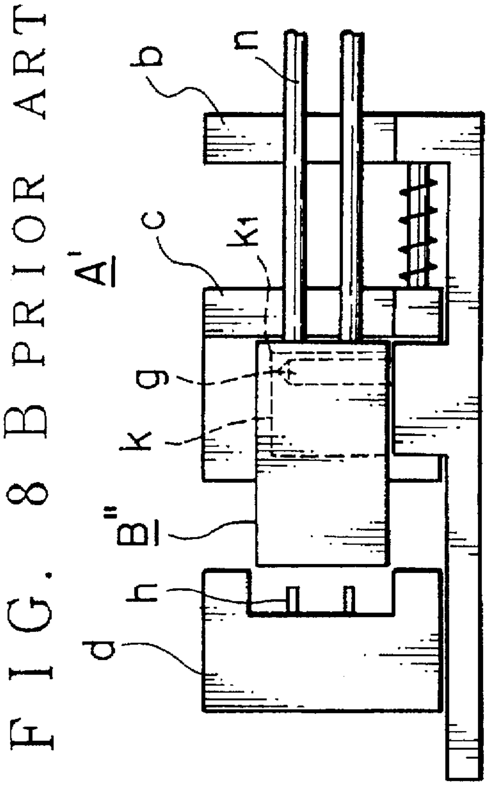
FIG. 8B PRIOR ART
Figure 8D:
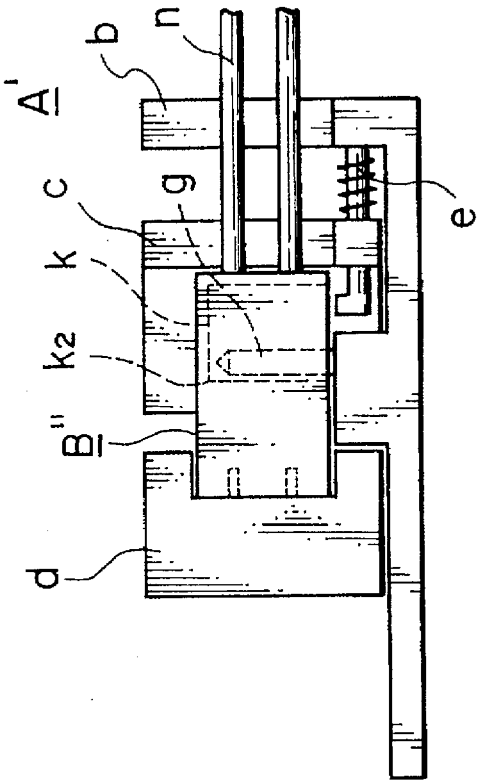
FIG. 8D PRIOR ART

FIG. 3 shows the connector inspecting device A. A connector supporting body 16 is fixed to a stand 15 thereof, and an inspecting device body 17, which moves with respect to the connector supporting body 16, is provided, with inspecting pins 18 being provided for the inspecting device body 17.

A pair of switch elements $S_1$ and $S_2$, which are biased by means of springs 19, are provided at the connector supporting body 16, the pair of switch elements $S_1$ and $S_2$ forming a switch S of a correcting operation detecting circuit. Then, when a connector BC to be inspected is set in the connector supporting body 16, the rear end of the connector housing B presses the switch element $S_2$ and the free end 8*a* of the correcting operation resilient piece 8, if not deformed, does not press the switch element $S_1$ positioned at the outside of the connector housing B so that it causes the switch elements $S_1$ and $S_2$ to be placed in mutual contact, with the result that the switch S is closed (referring to FIG. 3B). When the correcting operation is executed by the inserted position correcting jig T, since the free end of the resilient correcting operation checking piece 8 is deformed and projects in an outward direction from the opening 7, the free end 8*a* presses the switch element $S_1$ so that the switch S is not closed.

It is permitted that the switch element $S_1$ is caused to face toward the resilient correcting operation checking piece 8 within the side wall 6 of the connector housing B; namely, on the condition that the resilient correcting operation checking piece 8 is not deformed, thus pressing the switch element against switch element $S_2$ so as to close the switch S thereby indicting the presence of an incompletely inserted terminal within the connector housing.

Consequently, in accordance with the open or closed condition of the switch, it can be determined by an indicating device (not shown) whether or not the correcting operation of the metallic terminal parts by the inserted position correcting jig T has been performed.

As described above, according to the present invention, the terminals in an incompletely inserted condition are capable of being shifted to a completely inserted condition by virtue of the correcting operation by using the correcting jig. By determining whether or not the correcting operation has been performed at the time of continuity inspection of the metallic terminal parts by means of the connector inspecting device, one is able to determine with certainty whether or not there are metallic terminal parts which are in a condition of being incompletely inserted about the connector.

While preferred embodiments of the invention have been described using specific terms, such description is for illustrative purpose only, and it is to be understood that changes and variations may be made without departing from the spirit or scope of the following claims.

What is claimed is:

1. A method for inspecting connector engagement for determining an existence of an incomplete insertion of metallic terminal parts into a connector housing, wherein said metallic terminal parts are received in terminal-receiving chambers in said connector housing and locked therein by resilient locking pieces provided in said chambers upon completion of the insertion of said metallic terminal parts, said method comprising the steps of:

moving metallic terminal parts, which are at an incompletely inserted position, into a completely inserted position thereof by a terminal insertion device;

deflecting a resilient correcting operation checking piece provided in said connector housing by said terminal insertion device upon complete insertion of said metallic terminal parts; and detecting a position of a free end section of said deflected resilient correcting operation checking piece at the time of a continuity inspectioin for said metallic terminal parts by a connector inspecting device.

2. A method for inspecting connector engagement as claimed in claim 1, wherein said resilient correcting operation checking piece is provided within the thickness of a side wall of said connector housing.

3. A method for inspecting connector engagement as claimed in claims 1 or 2, further comprising a step of locking said free end section of said resilient correcting operation checking piece in a condition in which said free end section is projected from an opening formed in a side wall of said connector housing.

4. A device for inspecting metallic terminal parts engagement in a connector comprising:

a connector inspecting device having a connector supporting body for receiving a connector housing to be inspected; and switch elements cooperating to form a correcting operation detecting circuit carried by said connector supporting body, one of said switch elements being so disposed as to be pushed by a free end section of a resilient correcting operation checking piece in a connector to be inspected when said resilient correcting operation checking piece is deflected by a terminal insertion device upon complete insertion of said metallic terminal parts in said connector.

5. A device for inspecting connector engagement as claimed in claim 4 wherein said one switch element is normally biased toward the connector by means of a spring.

* * * * *